(12) United States Patent
Sheperek et al.

(10) Patent No.: US 10,658,066 B2
(45) Date of Patent: May 19, 2020

(54) FIRST-PASS CONTINUOUS READ LEVEL CALIBRATION

(71) Applicant: Micron Technology, Inc., Boise, ID (US)

(72) Inventors: Michael Sheperek, Longmont, CO (US); Larry J. Koudele, Erie, CO (US); Bruce A. Liikanen, Berthoud, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/122,380

(22) Filed: Sep. 5, 2018

(65) Prior Publication Data

US 2020/0075120 A1    Mar. 5, 2020

(51) Int. Cl.
*H04L 7/00* (2006.01)
*G11C 29/50* (2006.01)
*H04L 1/20* (2006.01)
*G11C 7/10* (2006.01)
*G11C 16/10* (2006.01)
*G11C 16/34* (2006.01)

(52) U.S. Cl.
CPC ...... *G11C 29/50004* (2013.01); *G11C 7/1051* (2013.01); *G11C 16/10* (2013.01); *G11C 16/34* (2013.01); *H04L 1/203* (2013.01); *G11C 2207/2254* (2013.01); *G11C 2216/16* (2013.01)

(58) Field of Classification Search
CPC . G11C 29/50004; G11C 7/1051; G11C 16/10; G11C 16/34; G11C 2207/2254; G11C 2216/16; H04L 1/203

USPC .................................................. 375/355, 354
See application file for complete search history.

(56) References Cited

U.S. PATENT DOCUMENTS

| | | | |
|---|---|---|---|
| 8,099,652 B1 * | 1/2012 | Alrod .................. | G06F 11/1072 714/763 |
| 8,499,227 B2 | 7/2013 | Liikanen et al. | |
| 8,862,969 B2 | 10/2014 | Liikanen | |
| 10,140,040 B1 | 11/2018 | Koudele et al. | |
| 10,402,272 B2 | 9/2019 | Liikanen et al. | |
| 2009/0310421 A1 * | 12/2009 | Cernea ................ | G11C 11/5628 365/185.19 |
| 2013/0185612 A1 * | 7/2013 | Lee ...................... | G06F 11/0751 714/773 |
| 2018/0341416 A1 | 11/2018 | Koudele et al. | |
| 2018/0341553 A1 | 11/2018 | Koudele et al. | |
| 2019/0096490 A1 * | 3/2019 | Madraswala .......... | G11C 16/26 |

* cited by examiner

*Primary Examiner* — Helene E Tayong
(74) *Attorney, Agent, or Firm* — Lowenstein Sandler LLP

(57) ABSTRACT

Described herein are embodiments related to first-pass continuous read level calibration (cRLC) operations on memory cells of memory systems. A processing device determines that a first programming pass of a programming operation has been performed on a memory cell of a memory component. The processing device performs a cRLC operation on the memory cell to calibrate a read level threshold between a first first-pass programming distribution and a second first-pass programming distribution before a second programming pass of the programming operation is performed on the memory cell.

20 Claims, 11 Drawing Sheets

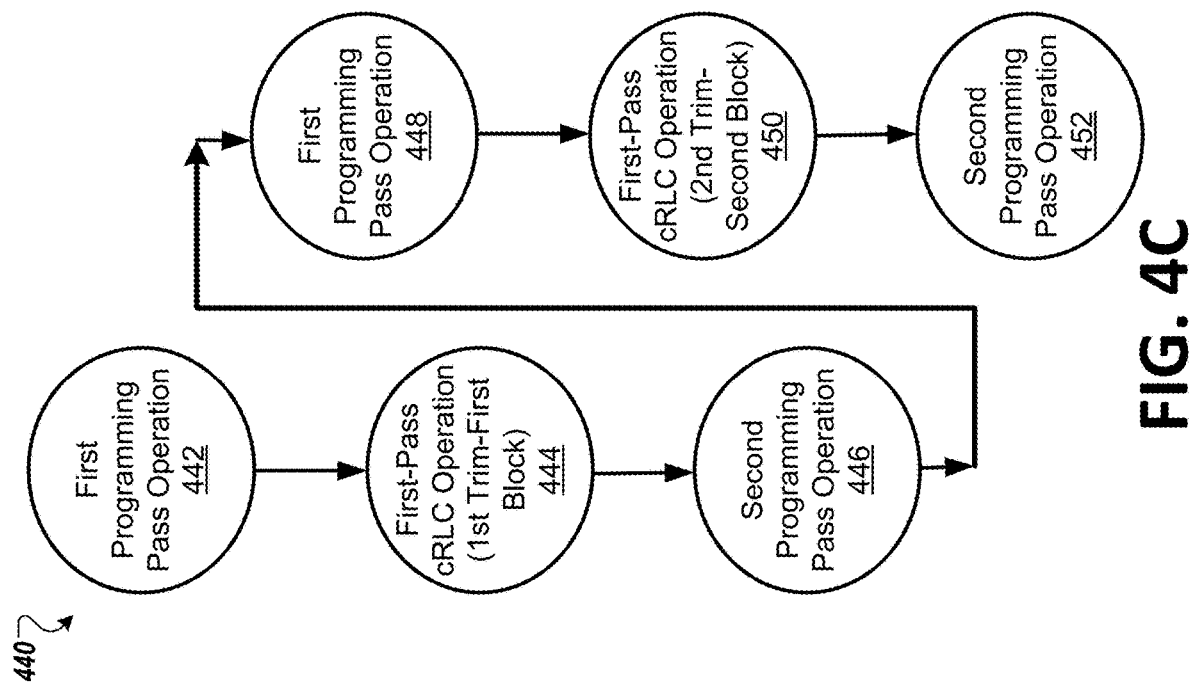
FIG. 4C
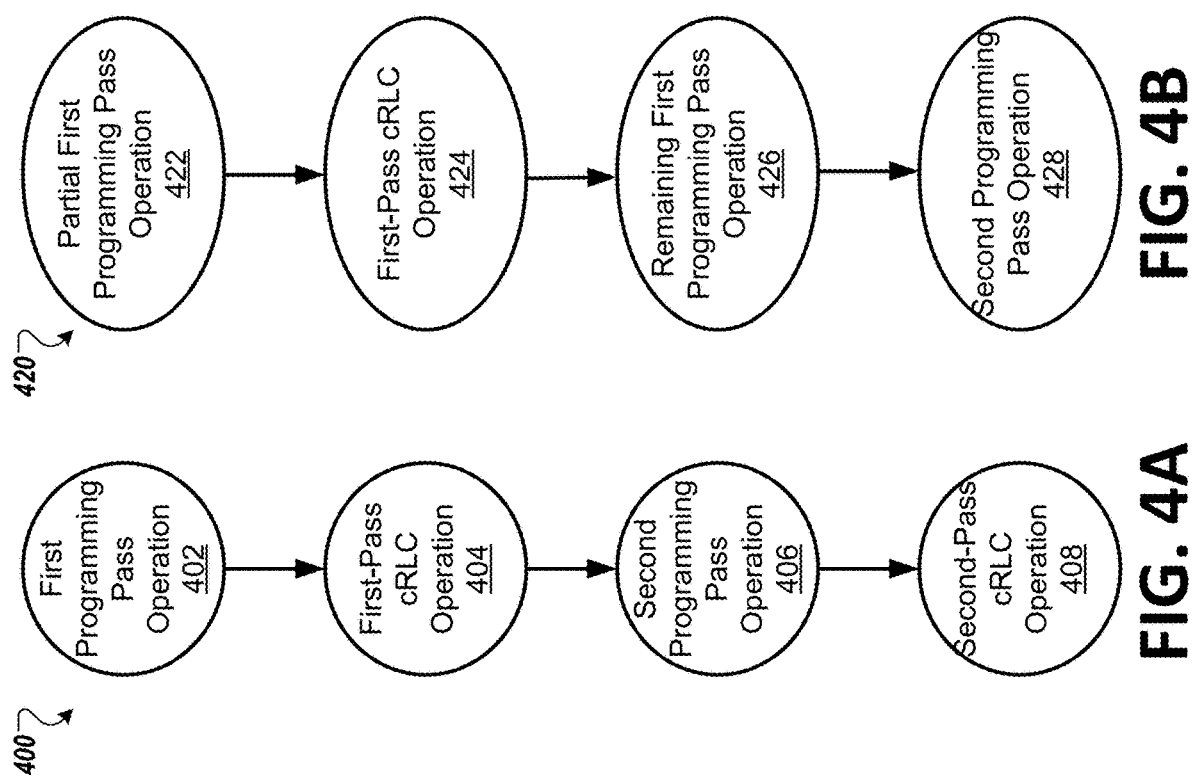
FIG. 4B
FIG. 4A

FIRST-PASS CONTINUOUS READ LEVEL CALIBRATION

TECHNICAL FIELD

Embodiments of the disclosure relate generally to memory sub-systems, and more specifically, relate to first-pass continuous read level calibration (cRLC) operations on memory cells of the memory sub-systems.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

FIG. 4A is a flow diagram of an example method of performing first-pass cRLC operations in connection with a two-pass programming operation in accordance with some embodiments of the present disclosure.

FIG. 4B is a flow diagram of an example method of performing first-pass cRLC operations in connection with a two-pass programming operation in accordance with some embodiments of the present disclosure.

FIG. 4C is a flow diagram of an example method of performing first-pass cRLC operations in a connection with two-pass programming operation in accordance with some embodiments of the present disclosure.

DETAILED DESCRIPTION

Figure 1:
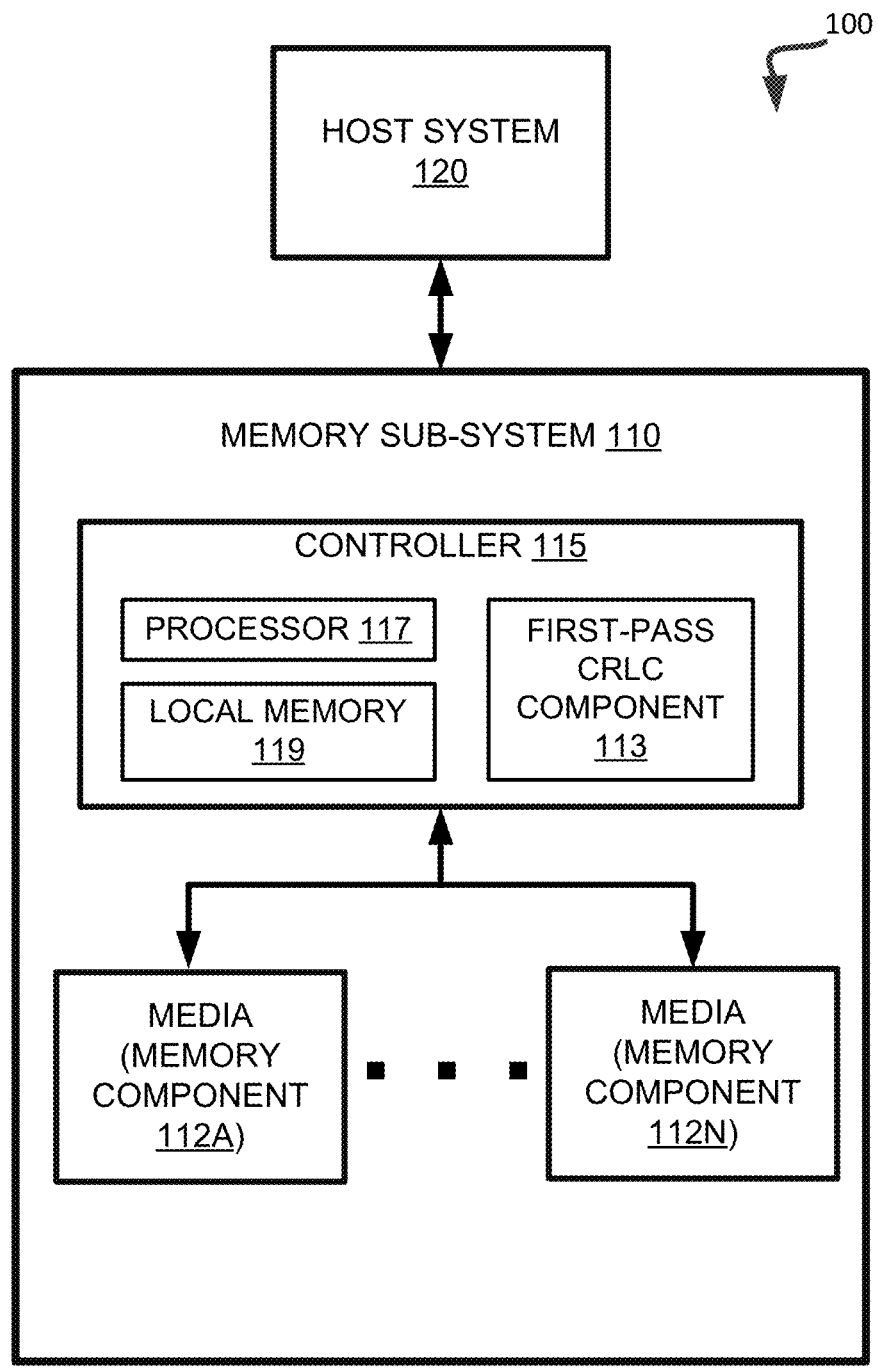
FIG. 1 illustrates an example computing environment that includes a memory sub-system in accordance with some embodiments of the present disclosure.

Aspects of the present disclosure are directed to first-pass continuous read level calibration. A memory sub-system is also hereinafter referred to as a "memory device" or "memory system." An example of a memory sub-system is a storage system, such as a solid-state drive (SSD). The memory sub-system can be a hybrid memory/storage sub-system. In general, a host system can utilize a memory sub-system that includes one or more memory components. The memory devices can include non-volatile memory devices, such as, for example, negative-and (NAND). The host system can provide data to be stored at the memory sub-system and can request data to be retrieved from the memory sub-system.

A single-level cell (SLC) can store only one bit per memory element, whereas a multi-level cell (MLC) is a memory element that is capable of storing more than a single bit of information. It should be noted that the state of the memory cell can be programmed and the state of the memory can be determined by comparing a read voltage of the memory cell against one or more read level thresholds. That is, with a SLC NAND flash technology, each cell can exist in one of the two states, storing one bit of information per cell, whereas MLC NAND flash memory has four or more possible states per cell, so it can store two or more bits of information per cell. The higher number of possible states reduces the amount of margin separating the states. The memory device can include triple-level cell (TLC) memory. In TLC memory, the memory cell stores three bits of information per cell with eight total voltage states. The memory device can include a quad-level cell (QLC) memory. In QLC memory, each memory cell can store four bits of information, with sixteen voltage states. For example, in a QLC memory, a memory cell can store four bits of data (e.g., 1111, 0000, 1101, etc.) corresponding to data received from the host system using the sixteen voltage states. Each bit of the memory cell is stored at a different portion (also referred to as "page" hereafter) of the memory cell. Various read level thresholds can be used for the various page types: SLC page types are lower pages (LPs), MLC page types are LPs and upper pages (Ups), TLC page types are LPs, Ups, and extra pages (XPs), and QLC page types are LPs, Ups, XPs and top pages (TPs). For example, a memory cell of the QLC memory can have a total of four pages, including a lower page (LP), an upper page (UP), an extra page (XP) and a top page (TP), where each page stores a bit of data. For example, a bit can be represented by each of the four pages of the memory cell. In a memory cell for a QLC memory, each combination of four bits can correspond to a different voltage level (also referred to as "level" hereafter). For example, a first level of the memory cell can correspond to 1111, a second level can correspond to 0111, and so on. Because a memory cell for a QLC memory includes 4 bits of data, there is a total of 16 possible combinations of the four bits of data. Accordingly, a memory cell for a QLC memory can be programmed to one of 16 different levels.

Generally, the memory system receives a request from a host system to perform a programming operation to store data at the QLC memory. A controller of the memory system can store the data by performing multi-pass programming (e.g., two or more programming passes) that each programs or stores data at the memory cell. A first programming pass can program data at the memory cell at a particular time. At a later time, a second programming pass can be performed on the memory cell to store additional data at the memory cell and the second programming pass requires and uses the information stored in the first programming pass. A certain amount of time can elapse between the memory sub-system performing the first programming pass and performing the second programming pass on the same memory cell. During a first programming pass of a two-pass programming operation, the controller can apply one or more voltage levels to the memory cell to program a first set of bits (e.g., 3 bits in 3 pages). During a second programming pass of the two-pass programming operation, the controller can apply one or more voltage levels to the memory cell to program an additional bit to the first set of bits (e.g., 4 bits in 4 pages). The level that the memory cell is programmed to in the second programming pass can be based on the last page of the memory cell as well as the prior pages that were programmed at the memory cell in the first programming pass. Therefore, if data stored at any of the pages of the memory cell during the first programming pass includes an error and the error is not corrected before the second programming pass is performed on the memory cell, then the memory cell will be programmed to the wrong level (also referred to as "level misplacement" hereafter), resulting in an increased error rate for the data stored at the memory cell. These types of errors can be considered as write-in errors, where the wrong data is written to the memory cell. Level misplacements can result in high reliability errors of the data stored at the memory cell, which can deteriorate the performance of the memory system if a large number of error correction operations are to be performed.

A memory component of a conventional memory sub-system can be calibrated to reduce the errors, but these calibrations are performed periodically and after blocks of the memory component are fully programmed. For example, as the memory component deteriorates, the read level thresholds of memory cells can be calibrated. These calibrations are performed on a block of the memory component after the block is fully programmed. However, as described above, any memory cell that is programmed with an error level during the first programming pass will result in the memory cell being programmed to the wrong level during the second programming pass.

Aspects of the present disclosure address the above and other deficiencies by performing first-pass cRLC while a block is being programmed rather than after a block is fully programmed. The cRLC algorithm continuously samples valleys of programming distributions (also referred to as Vt distribution valleys) associated with each read level threshold of the memory cells. The same operations of a cRLC algorithm that can be used on a fully programmed block are applied between programming passes of a multi-pass programming operation. The samples (also referred to as cRLC samples) are obtained while the block is being programmed, as opposed to after the block is fully programmed. The first-pass cRLC measures and collects information about the distribution valleys, such as the center bit error count (CenterBEC) and the difference error count (DiffEC) measurements. The first-pass cRLC is performed just prior to the second programming pass so that all floating gate aggression is included in the first-pass cRLC measurements. This can reduce or minimize the probability of level misplacement errors during the second programming pass due to NAND pre-read bit errors, thereby improving quality of the memory component and reducing the risk of an Uncorrectable Error Correction Code (UECC) fatal drive error. The first-pass cRLC improves quality by continually tracking and changing the behavior of the memory component (i.e., NAND behavior such as program/erase cycles and temperature) over time. Using the first-pass cRLC, the first-pass read threshold trims can be modified rather than the read threshold trims that are modified conventionally after the block is fully programmed. The first-pass cRLC measurements can also be used for various types of Dynamic Program Targeting (DPT) operations. A DPT operation controls the program verify (PV) target placement such that the programming distributions are placed in a beneficial arrangement. The first-pass cRLC can be used to pass information to be used in a first-pass DPT operation or a second-pass DPT operation. When used with a second-pass DPT operation, the first-pass cRLC tracks "drag along" changes to the first-pass PV targets that are made by DPT. When used with the first-pass DPT, the first-pass cRLC tracks the changes to the first-pass PV targets that are made by the first-pass DPT. When included in a manufacturing process of the memory system, the first-pass cRLC establishes an optimum starting point for second-pass cRLC and allows all forms of the cRLC operation to operate at known settings so that the burden of maintaining these settings is reduced. The first-pass cRLC also enables interleaved operations for reduced Quality of Service (QoS) impact. When first-pass cRLC is included in a full-system implementation where both first-pass and second-pass cRLC and DPT are performed in an interleaved or concurrent method, the memory system is continually maintained at its optimum and controlled margin through the life of the memory system and through all operating environments. Aspects of the present disclosure can achieve other benefits in addition to those expressly set forth above.

The cRLC operation is a read level calibration that can be done for each of the multiple read level threshold registers used during all read operations. It should be noted that the cRLC operation may be a set of one or more operations to calibrate one or more read level thresholds, regardless of whether the read level thresholds are all partially or completely centered. In other cases, the cRLC has a set of one or more operations to adjust one or more read level thresholds. The cRLC operation can be done to keep each threshold centered so that the memory component can achieve the best overall bit error rate (BER) possible. It is referred to as continuous because the algorithm samples continually at discrete intervals. For example, a sample, which may be a set of three reads, can be made at about 1 sample operation in every 1 to 30 seconds, depending on the requirements. Each sample initiated by the cRLC algorithm returns data for a particular die and a particular page type threshold so that over many of these operations, the information is aggregated and fed back in a closed loop system such that each die/threshold is kept optimized (i.e., the read level threshold is centered). In one implementation, a sample is three reads from the same read threshold valley (or same trim register). The read level thresholds of the memory component can start with manufacturing default read level thresholds. The cRLC algorithm can be run during a test mode so that all read level offset trims of all word line groups (WLGs) of all dies in the memory system will have converged. Convergence is when a read level trim has the value that returns the fewest number of page or code word errors. This is what is called the calibrated or centered value and results in the best BER.

The DPT operation is a PV targeting calibration that can be done for each PV target. It should be noted that the DPT operation may be a set of one or more operations to calibrate one or more PV targets, regardless of whether the programming distributions are balanced partially or completely. In other cases, it can be considered to be a DPT calibration having a set of one or more operations to adjust PV target placement. The DPT operation adjusts multiple page types such that the BER of each page type will be approximately the same through the life of the memory system and through all operating environments (e.g., minimizes BER sigma). For example, the DPT operation can adjust the three TLC page types: Lower Page (LP), Upper Page (UP), and Extra page (XP) such that the BER of each of these three page types will be approximately the same (i.e., balanced). The DPT operation uses the cRLC as the feedback metric in a closed loop feedback system. The DPT operation, in addition to balancing page type BER, keeps the BER of each page type balanced dynamically by performing the DPT operation during block programming, such as between the first programming pass and the second programming pass of a multi-pass programming operation on a block. This can reduce the average trigger rate throughout the life of each die, including end-of-life (EOL) conditions. The DPT operation can increase endurance (i.e., more total Program/Erase cycles) for each die in a memory system. Using the DPT operation, no one page type will dominate the end of life criteria. The DPT operation can be performed independently within each word line group, regardless of the page map. The program targets of the memory component can start with manufacturing default program targets. The DPT algorithm can be run during a test mode so that all program targets of all word line groups (WLGs) of all dies in the memory system have been balanced (i.e., when the BERs of the page types are approximately the same). In the test mode, the cRLC and DPT algorithms can run at an accelerated rate for a short period of time in the factory so that each WLG will have optimized and converged the cRLC read thresholds prior to deployment.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as a group of memory cells, wordlines, wordline groups, or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a first-pass continuous read level calibration (cRLC) component 113 that can be used to calibrate read level thresholds of memory cells of a memory component based read samples obtained between programming passes of a multi-pass programming operation on a block. In some embodiments, the controller 115 includes at least a portion of the first-pass cRLC component 113. For example, the controller 115 can include a processor 117 (processing device) configured to execute instructions stored in local memory 119 for performing the operations described herein. In some embodiments, the first-pass cRLC component 113 is part of the host system 110, an application, or an operating system.

The first-pass cRLC component 113 can determine that a first programming pass of a programming operation has been performed on one or more memory cells of the memory components 112A to 112N of the memory sub-system 110. The first-pass cRLC component 113 can perform a cRLC operation on the one or more memory cells to calibrate one or more read level thresholds, each between a pair of first-pass distributions before a second programming pass of the programming operation is performed on the one or more memory cells.

The first-pass cRLC component 113 can perform a multi-pass programming operation that has more than two programming passes and a first-pass cRLC operation can be performed before one or more of the subsequent programming passes. For example, during programming a memory component with a three programming passes, such as a two-eight-sixteen (2/8/16) distribution algorithm, the first-pass cRLC component 113 can perform a cRLC operation between the first and second programming passes or between the second and third programming passes. The first-pass cRLC component 113 can perform one cRLC operation between the first and second programming passes and another cRLC operation between the second and third programming passes. Further details with regards to the operations of the first-pass cRLC component 113 are described below.

Figure 2:
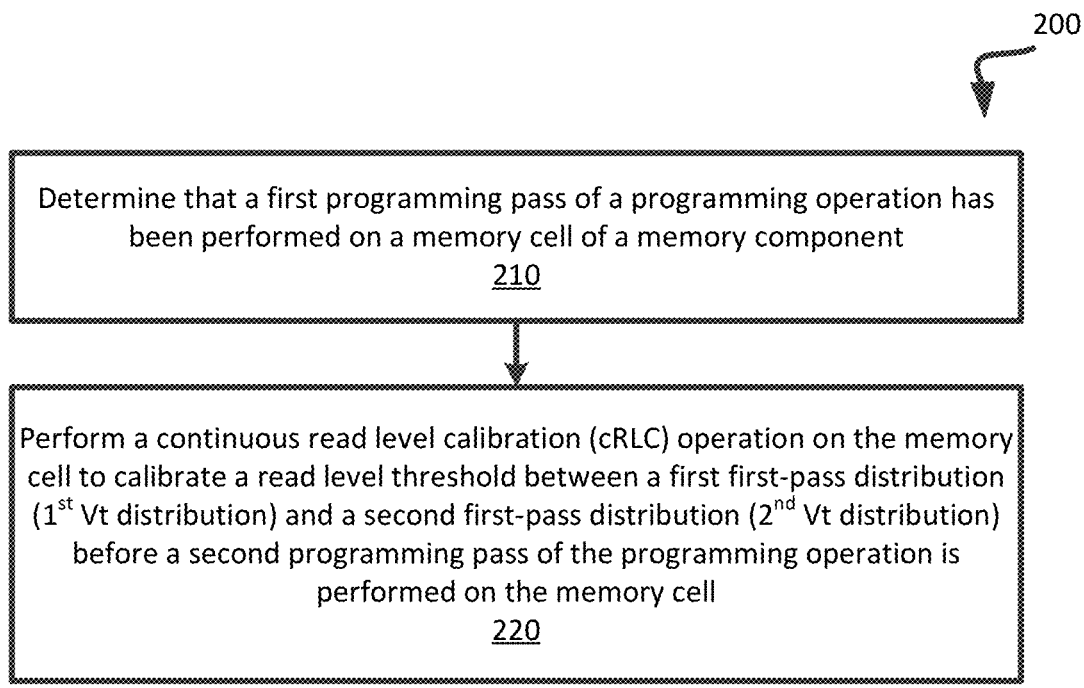
FIG. 2 is a flow diagram of an example method to calibrate a read level threshold between programming distributions after a first programming pass and before a second programming pass of a memory cell in accordance with some embodiments of the present disclosure.

FIG. 2 is a flow diagram of an example method 200 to calibrate a read level threshold between programming distributions after a first programming pass and before a second programming pass of a memory cell, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the memory first-pass cRLC component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 210, the processing logic determines that a first programming pass of a programming operation has been performed on a memory cell of the memory component. The memory cell may be a multi-level cell (MLC) and the programming operation may include two or more programming passes. The processing logic can also determine that a second programming pass of the programming operation has not been performed on the memory cell. At block 220, the processing logic performs a continuous read level calibration (cRLC) operation on the memory cell to calibrate a read level threshold between a first first-pass programming distribution ($1^{st}$ Vt distribution) and a second first-pass programming distribution ($2^{nd}$ Vt distribution) before the second programming pass is performed on the memory cell. In one embodiment, the CRLC operation is performed until the read level threshold is centered between the $1^{st}$ Vt distribution and the $2^{nd}$ Vt distribution. Alternatively, the read level threshold can be incrementally adjusted to improve minimum bit error rate (BER) settings.

In a further embodiment, the processing logic performs a second cRLC operation on the memory cell to calibrate a second read level threshold between the second first-pass programming distribution ($2^{nd}$ Vt distribution) and a third first-pass programming distribution ($3^{rd}$ Vt distribution) before the second programming pass of the programming operation is performed on the memory cell. In another embodiment, the processing logic performs a second cRLC operation on the memory cell to calibrate a second read level threshold between the second first-pass programming distribution ($2^{nd}$ Vt distribution) and a third first-pass programming distribution ($3^{rd}$ Vt distribution) after the second programming pass of the programming operation is performed on the memory cell. Alternatively, the processing logic performs one or more cRLC operations on the memory cell to calibrate all read level threshold between each of the first-pass distributions before the second programming pass of the programming operation is performed on the memory cell.

In one embodiment, when a read sample is taken, there are actually three reads done in sequence, including a low Vt read, a high Vt read, and a center Vt read. The center Vt read is a register value that is a cRLC center value, the low Vt read is a register value that is the cRLC center value less a negative offset value, and the high Vt read is a register value that is the CRLC center value plus a positive offset value. If a read threshold were to be swept by a BER sweep, ideally, the cRLC center value should be the lowest value in the valley. However, when the memory cell is not calibrated, the cRLC center value is not the lowest. The cRLC algorithm centers the cRLC center value by balancing the side samples. When the side samples are nearly equal (balanced), the cRLC center value can become centered at the deepest point in the BER sweep. For the read sample, a difference error count (DiffEC) can be computed. The DiffEC is the difference between the average of the positive and negative offset sample bit error rate counts and the center sample bit error count. More specifically, the DiffEC measurement is the mean of the two side samples minus the center value. Also, the center bit error count (CenterBEC) is calculated. These values can be used to determine where the read level threshold should be set. A space between all of the valleys at some error count (in volts) is called read window budget (RWB). RWB is an indication of how much margin a part has to read data without errors. The greater the RWB, the more margin that exists. The best BER for a page exists when all read level thresholds for that page type are centered by cRLC and the RWB for each page type valleys are approximately the same. The DiffEC and CenterBEC can be stored and used by the DPT algorithm as feedback information in setting the PV targets.

In one embodiment at block 220, the processing logic iteratively performs a read operation on the memory cell to obtain a read sample. The processing logic also iteratively measures a BER for the memory cell. The processing logic iteratively adjusts the read level threshold of the memory cell based on the BER of the memory cell to center the read level threshold between the $1^{st}$ Vt distribution and the $2^{nd}$ Vt distribution. In another embodiment, the processing logic calculates a center bit error count (CenterBEC) and a difference error count (DiffEC). These values can be stored for each of the respective read level thresholds in local memory. Once stored, these values can be used by program targeting that controls PV target placement, such as dynamic program targeting (DPT), first-pass DPT, or the like.

In another embodiment, the memory component includes a block with multiple memory cells organized in wordlines and wordline groups. The memory cell can be a sample cell of a first wordline group of the multiple wordline groups. The block can further include a second sample memory cell in a second wordline group of the multiple wordline groups. In one embodiment, the processing logic determines that the first programming pass has been performed on the second sample memory cell and that the second programming pass has not been performed on the second sample memory cell. The processing logic performs a second cRLC operation on the second sample memory cell to calibrate a read level threshold between a first first-pass programming distribution ($1^{st}$ Vt distribution) and a second first-pass programming distribution ($2^{nd}$ Vt distribution) before the second programming pass is performed on the second sample memory cell.

In another embodiment, the memory component has a first block with the memory cell and a second block including a second memory cell. After block 220, the processing logic determines that the first programming pass has been performed on the second memory cell. The processing logic performs a second cRLC operation on the second memory cell to calibrate a read level threshold between a first first-pass programming distribution ($1^{st}$ Vt distribution) and a second first-pass programming distribution ($2^{nd}$ Vt distribution) before the second programming pass is performed on the second memory cell.

In one embodiment, the memory cell, after the first programming pass, includes the $1^{st}$ Vt distribution, the $2^{nd}$ Vt distribution, a third first-pass programming distribution ($3^{rd}$ Vt distribution), and a fourth first-pass programming distribution ($4^{th}$ Vt distribution). The read level threshold is between the $1^{st}$ Vt distribution and the $2^{nd}$ Vt distribution as described above. Also, a second read level threshold is between the $2^{nd}$ Vt distribution and the $3^{rd}$ Vt distribution, and a third read level threshold is between the $3^{rd}$ Vt distribution and the $4^{th}$ Vt distribution. The memory cell, after the second programming pass, includes eight Vt distributions and seven read level thresholds, each between two of the eight Vt distributions. Additional details of the multi-pass programming sequences are described and illustrated with respect to FIGS. 5-6.

In another embodiment, the memory cell, after the first programming pass, includes eight Vt distributions comprising the $1^{st}$ Vt distribution and the $2^{nd}$ Vt distribution. The memory cell, after the first programming pass, includes seven read level thresholds comprising the read level threshold. The memory cell, after the second programming pass, comprises sixteen Vt distributions and fifteen read level thresholds, each between two of the sixteen Vt distributions. Additional details of the multi-pass programming sequences are described and illustrated with respect to FIGS. 7-8.

Figure 9:
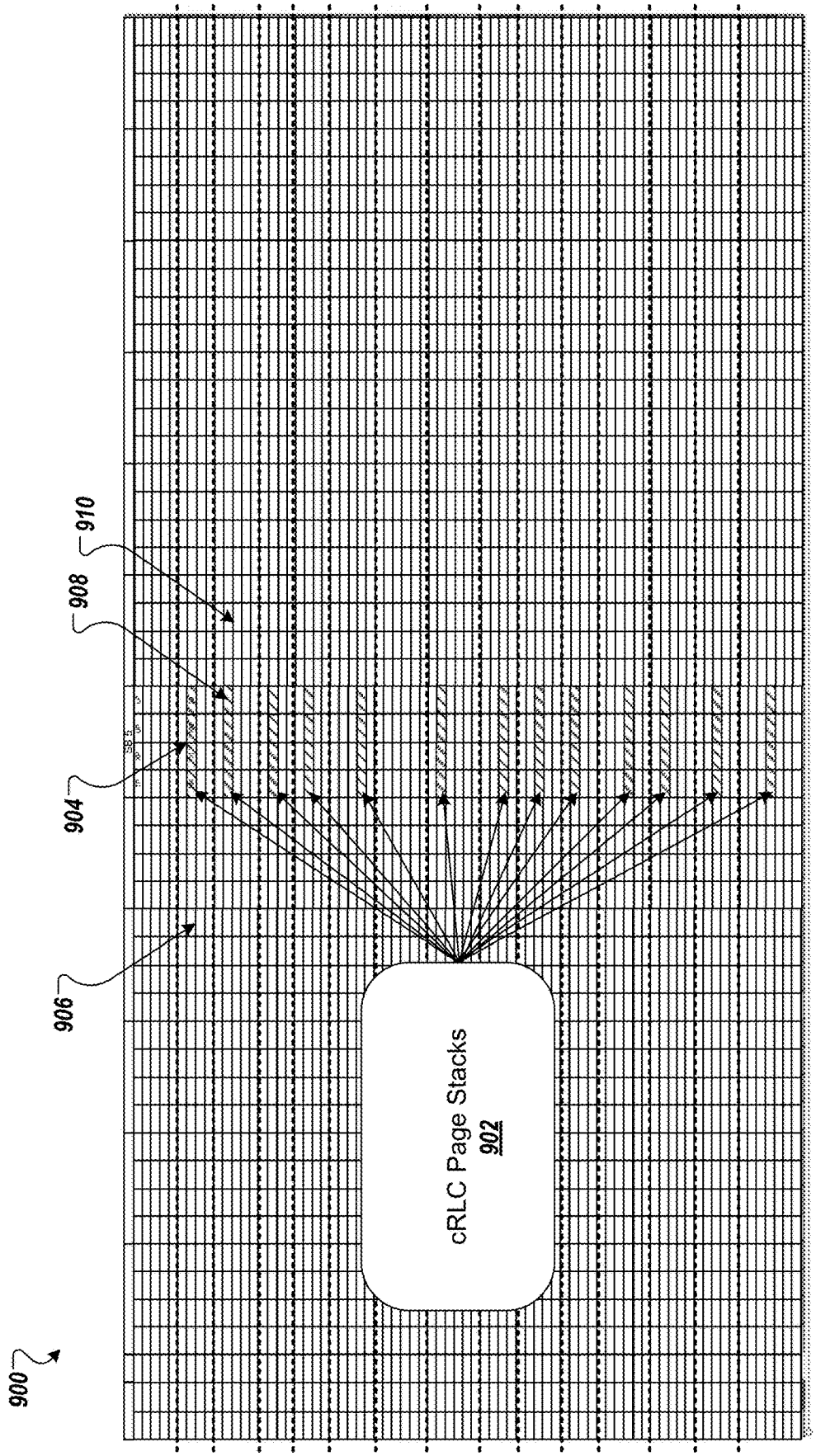
FIG. 9 is a page map of a memory block for a full block program operation with multiple CRLC page stacks in accordance with some embodiments of the present disclosure.
Figure 10:
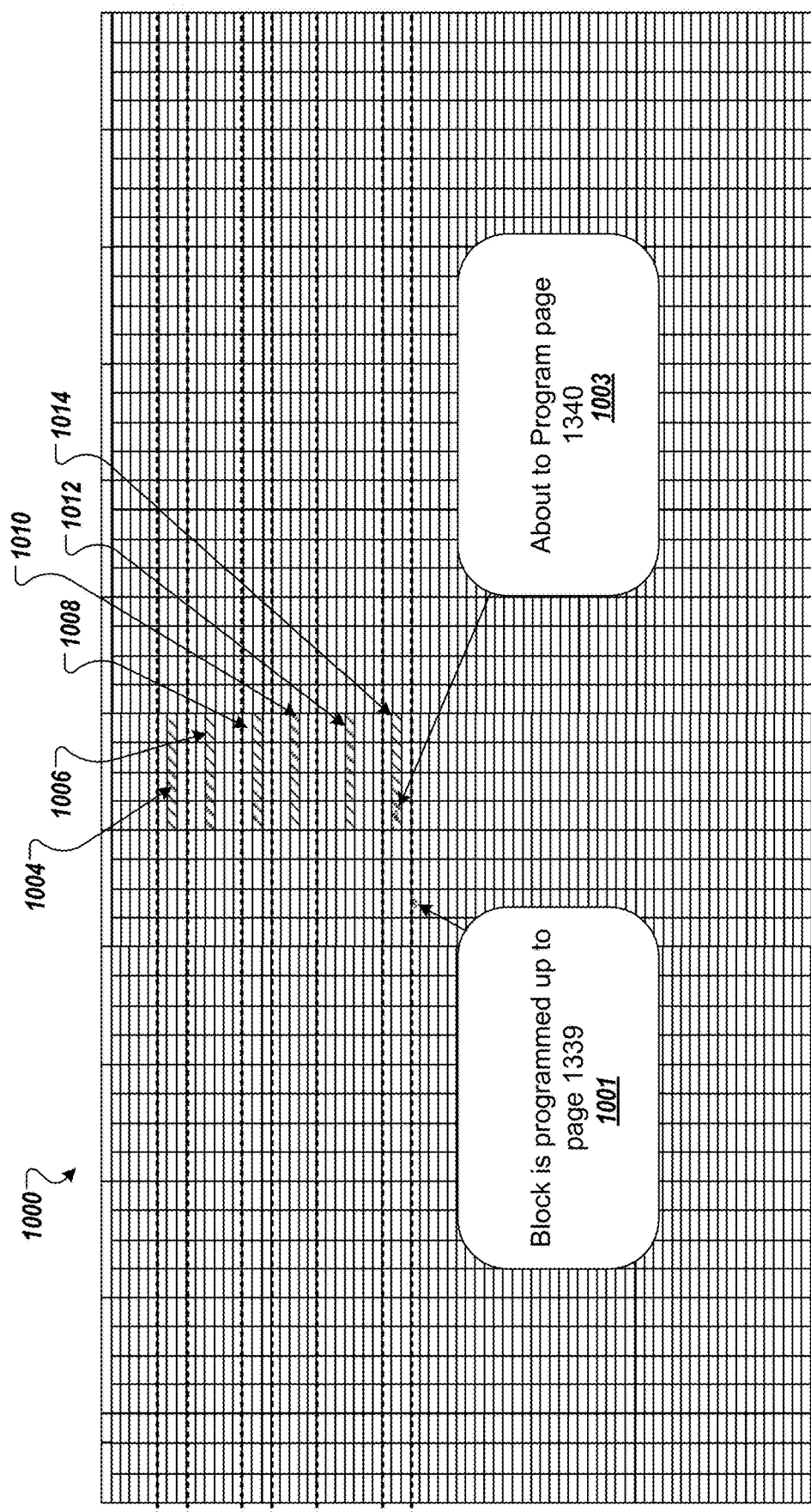
FIG. 10 is a page map of a memory block for a partial block program operation in accordance with some embodiments of the present disclosure.

In another embodiment, the processing logic identifies that a programming operation has been performed on a memory cell. In some embodiments, the programming operation is performed on a data block that includes a group of memory cells. As such, operations described herein can be performed on a data block (e.g., a group of memory cells) and/or individual memory cells. For example, the operations described with respect to a memory cell in the present disclosure can also be used with a data block that is a group of memory cells. The programming operation can be performed as part of a first programming pass that programs data at the memory cell of a memory component in a memory sub-system. The first programming pass can be part of a two-pass programming operation that includes a second programming pass that programs additional data at the memory cell after the first programming pass has been performed on the memory cell. The processing logic identifies that a subsequent programming operation has not been performed on the memory cell. For example, the memory sub-system can identify that the second programming pass has not been performed on the memory cell (e.g., time has elapsed since the first programming pass). The processing logic performs the cRLC operations to center each of the read level thresholds or at least one of the read level thresholds of the memory cell. In some embodiments, the cRLC operations are performed as part of a cRLC algorithm that continuously samples Vt distribution valleys associated with each read level threshold trim. The cRLC algorithm is applied to the first-pass programming operation, including the various described herein that set forth how and when cRLC samples and updates occur with respect to the first-pass programming operation. The first-pass cRLC measures and collects valley and difference error count information on the first-pass page stack just prior to the second-pass programming operation so that all floating gate aggression is included in the first-pass measurements (cRLCpass1 measurements). This can reduce or minimize the probability of misplacement errors during the second-pass programming operation due to NAND pre-read bit errors. As such, first-pass trims are modified rather than second-pass trims as done conventionally. Also, as described herein, the first-pass cRLC can be used in connection with first-pass DPT, but can also be used in the absence of first-pass DPT. In another embodiment, both first-pass cRLC and first-pass DPT can be performed while a block is being programmed rather than after a flock is fully programmed, such as illustrated in FIGS. 9-10.

In another embodiment, the processing logic interrupts a block programming sequence to perform cRLC during programming of the selected block used for first-pass cRLC. The processing logic can cause the programming interruption to occur at each page stack selected as one of the cRLC page stacks. Alternatively, the processing logic can cause the programming interruption to occur just before the second-pass programming when the first-pass distributions have fully aggressed floating gate coupling from their neighbors. During block programming each of the cRLC page stacks in each of the wordline groups is interrupted, the processing logic performs a cRLC until all valleys of the page stack are centered with minimum error rate. In another embodiment, the processing logic runs the full cRLC algorithm until all trims within the page stacks are confirmed to be at their minimum BER settings. In another embodiment, the processing logic spreads out the cRLC sampling and convergence to minimum BER settings over many programming operations. For example, the processing logic can use one cRLC sample on a given block programming to calibrate one trim at a time or less than all in one programming operation. The processing logic can use the next cRLC sample for that trim on the next block to be programmed and so on until enough blocks are programmed that all trims are converged to their minimum BER settings.

In another embodiment, the processing logic can store the cRLC information from each valley, the cRLC information from each valley, Center Bit Error Count (CenterBEC) and Difference to be used by the first-pass DPT. For example, the processing logic can pass to a DPT algorithm, the CenterBEC and DiffEC for determining Program Verify (PV) Target modifications according to the DPT rules.

In another embodiment, as illustrated and described below with respect to FIG. 10, the processing logic can block program a memory component, such as an N18A. The programming sequence is interrupted at just before programming Top Page 1340. At this point, and each of the other cRLC page stacks, cRLC is allowed to fully converge and become "Centered" before the programming sequence is resumed. The cRLC information is passed on to DPT to perform its rule based modification of the associated PV trims for the next programming operation.

In another embodiment, just as cRLC on fully programmed blocks takes multiple read samples to converge on the minimum BER settings, the processing logic in the first-pass cRLC uses multiple read samples for each trim used in the page stack for the first-pass pages. In this embodiment, the processing logic of the cRLC algorithm performs all the necessary read samples to attain the minimum BER on the first-pass pages before proceeding to program the second pass. This can reduce or minimize the probability that NAND Read bit errors will occur during the NAND pre-read operation of the second-pass programming. As block programming proceeds, the processing logic will interrupt it again at the next cRLC page stack just before the second-pass programming operation is performed. In another embodiment, all operations of cRLC could be run with interleaved operations between first-pass and second-pass operations.

In another embodiment, the first-pass and second-pass read operations where a trim is fully converged could occur on different blocks and that each read sample with cRLC operations could also occur on different blocks. For example, once deployed where it is expected that cRLC is generally well centered and the cRLC algorithm can maintain the centered valley settings, adjusting the centered valley settings over the life of the memory system. The cRLC algorithm can also track variations in valley positions due to program/erase cycles, temperature, retention, or the like. By spreading out the read samples over multiple blocks and over many different operations, the cRLC algorithm can make its decisions on data that is more representative of the entire memory system. The impact to Quality of Service (QoS) can be minimized because the memory system does not need to stop and perform many cRLC maintenance operations all at once before it continues on to perform Host operations, for example.

In another embodiment, Background Programming could be used where a block or number of blocks are reserved for background programming operations. These reserved blocks and the operations on these blocks are managed by the controller 115 independently of host operations and can be used for cRLC operations as well.

Subsequently to one or more of the cRLC operations being performed to calibrate the one or more memory cells, the processing logic performs a subsequent programming operation on the memory cell. The subsequent programming operation can be the second programming pass to store additional data at the memory cell. The second programming pass uses the data stored at the memory cell that was programmed during the first programming pass.

Figure 3:
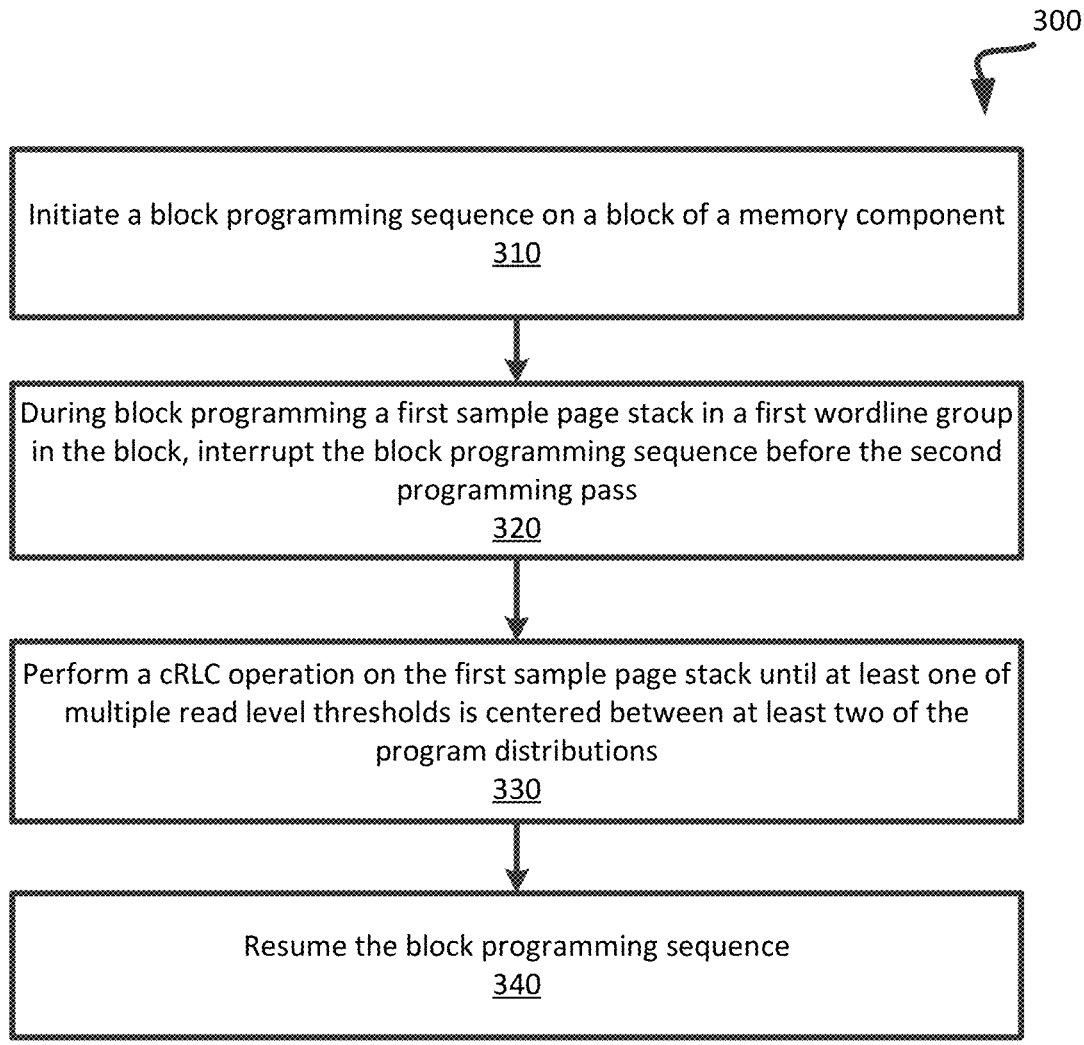
FIG. 3 is a flow diagram of an example method to perform a continuous read level calibration (cRLC) operation to center a read level threshold of a sample page stack in accordance with some embodiments of the present disclosure.

FIG. 3 is a flow diagram of an example method 300 to calibrate a read level threshold between programming distributions after a first programming pass and before a second programming pass of a memory cell, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the memory first-pass cRLC component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 310, the processing logic initiates a block programming sequence on a block of a memory component. The block programming sequence can be a multi-pass programming operation including one or more programming passes. In one embodiment, the block programming sequence includes at least a first programming pass and a second programming pass. At block 320, the processing logic, during block programming a first sample page stack in a first wordline group in the block, interrupts the block programming sequence before the second programming pass. At block 330, while the block programming sequence is interrupted, the processing logic performs a cRLC operation on the first sample page stack until at least one of the multiple read level thresholds is centered between at least two programming distributions. At block 340, the processing logic resumes the block programming sequence.

In a further embodiment, at block 330, the processing logic performs the cRLC operation on the first sample page stack until the multiple read level thresholds are each centered between a respective pair of programming distributions.

In a further embodiment, before or after block 340, the processing logic interrupts the block programming sequence before a second programming pass of a second sample page stack in a second wordline group during block programming. While the block programming sequence of the second sample page stack is interrupted, the processing logic performs a second cRLC operation on the second sample page stack until at least one read level threshold of multiple read level thresholds is centered between at least two programming distributions. After the processing logic resumes the block programming sequence.

In a further embodiment, the processing logic initiates a second block programming sequence on a second block of the memory component. The second block programming sequence includes at least a first programming pass and a second programming pass. During block programming a second sample page stack in a second wordline group in the second block, the processing logic interrupts the second block programming sequence before the second programming pass of the second block programming sequence. While the second block programming sequence is interrupted, the processing logic performs a second cRLC operation on the second sample page stack until at least another one of the multiple read level thresholds is centered between at least two programming distributions. After the processing logic resumes the second block programming sequence.

FIGS. 4A-4C are flow diagrams of example methods that can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the memory first-pass cRLC component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

FIG. 4A is a flow diagram of an example method 400 of performing first-pass cRLC operations in a two-pass programming operation in accordance with some embodiments of the present disclosure. At block 402, the processing logic performs a first programming pass operation on one or more memory cells of a memory block. At block 404, the processing logic performs the first-pass cRLC operation on one or more sample memory cells. At block 406, the processing logic performs a second programming pass operation on the one or more memory cells. At block 408, the processing logic performs a second-pass cRLC operation. This can be done before a third programming pass operation, for example. As described herein, the first-pass cRLC operation can run until all trims within the page stack (e.g., a sample memory cell) are confirmed to be at a specified BER setting (e.g., a minimum BER setting). Alternatively, the cRLC sampling and convergence to the specified BER setting can be spread out over many programming operations. For example only one trim within the stack gets one cRLC sample on a given block programming. The next block to be programmed would get the next cRLC sample for that trim and so on until enough blocks are programmed that all trims are converged to their specified BER settings.

FIG. 4B is a flow diagram of an example method 420 of performing first-pass cRLC operations in a two-pass programming operation in accordance with some embodiments of the present disclosure. At block 422, the processing logic performs a partial first programming pass operation on one or more memory cells of a memory block. At block 424, the processing logic performs the first-pass cRLC operation on one or more sample memory cells. At block 426, the processing logic performs the remaining first programming pass operation on the remaining memory cells of the memory block. At block 428, the processing logic performs a second programming pass operation on the one or more memory cells. As above, the cRLC sampling and convergence can be done on all trims or one trim at a time.

FIG. 4C is a flow diagram of an example method 440 of performing first-pass cRLC operations in a two-pass programming operation in accordance with some embodiments of the present disclosure. At block 442, the processing logic performs a first programming pass operation on one or more memory cells of a first memory block. At block 444, the processing logic performs the first-pass cRLC operation on one or more sample memory cells of the first memory block. The first-pass cRLC operation can be done to calibrate a first trim for the first memory block. At block 446, the processing logic performs the second programming pass operation on the first memory block. At block 448, the processing logic performs a first programming pass operation on one or more memory cells of a second memory block. At block 450, the processing logic performs the first-pass cRLC operation on one or more sample memory cells of the second memory block. The first-pass cRLC operation can be done to calibrate a second trim for the second memory block. At block 452, the processing logic performs the second programming pass operation on the second memory block. The method 440 can continue until enough blocks are programmed that all trims are converged to their specified BER settings (e.g., minimum BER settings).

Figure 5:
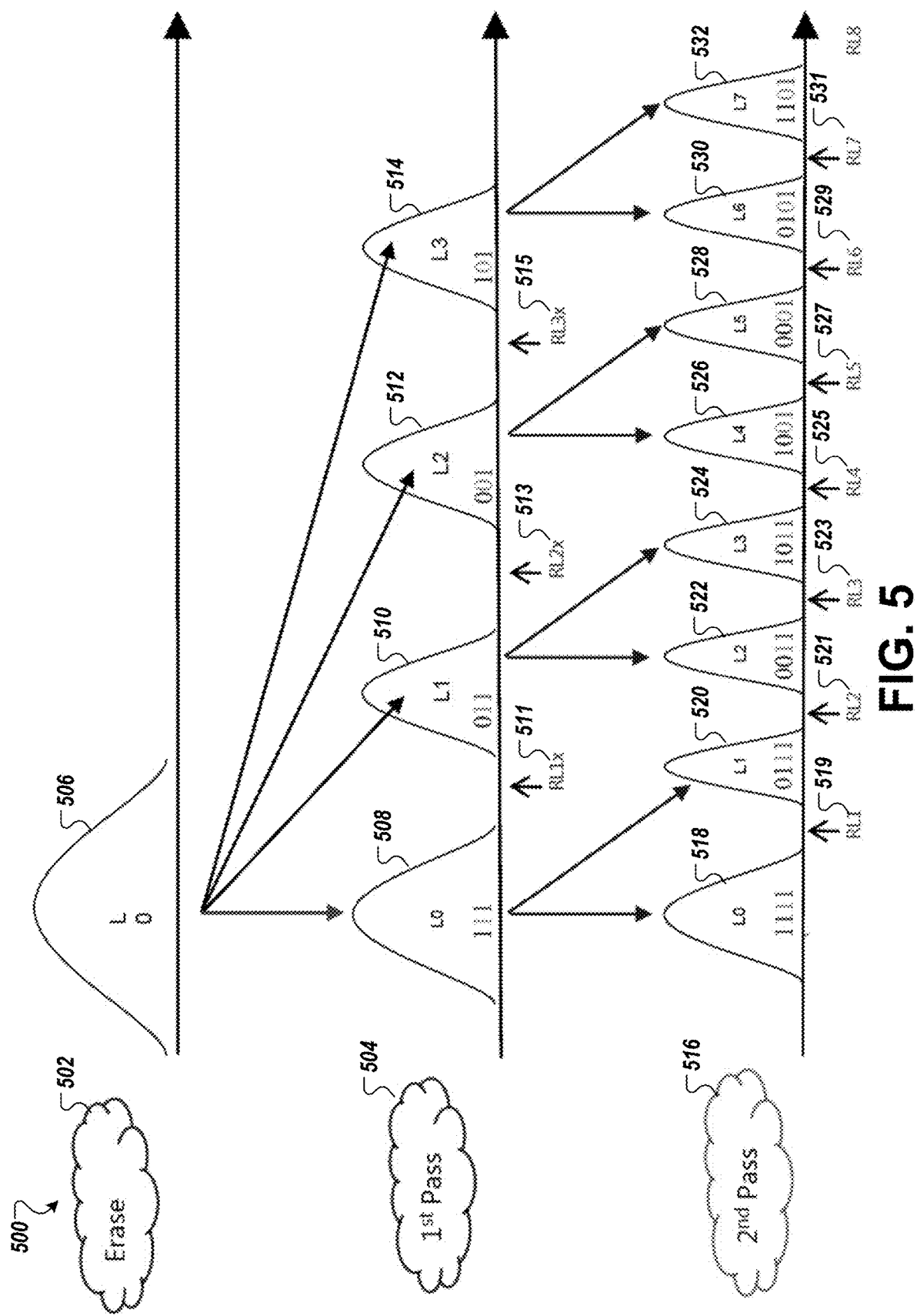
FIG. 5 illustrates a two-pass programming operation with four-to-eight programming distributions and corresponding read level thresholds in accordance with some embodiments of the present disclosure.

FIG. 5 illustrates a two-pass programming operation 500 with four-to-eight programming distributions and corresponding read level thresholds in accordance with some embodiments of the present disclosure. Before a first programming pass 504, a memory cell is in an erased state 502 and has a single Vt distribution 506 (also referred to as an erase distribution). After the first programming pass 504, the memory cell has four Vt distributions 508, 510, 512, 514 (also referred to as programming distributions or first-pass programming distributions) and three read level thresholds 511, 513, and 515. Before a second programming pass 516, the cRLC operation can be performed to calibrate one or more of the read level thresholds 511, 513, and 515. The read level thresholds 511, 513, and 515 can be adjusted to maintain minimum BER settings throughout the life of the memory cell and track variations in valley positions due to program/erase cycles, temperature, retention, or other factors. The read level thresholds 511, 513, and 515 can have corresponding trim values for the first programming pass 504 and these values can be adjusted to achieve a specified BER setting for the respective trim. Separate trims can exist for the read level thresholds of the cell after the first programming pass 504 and for the read level thresholds of the cell after the second programming pass 516. After the cRLC operation is performed to calibrate one or more of the read level thresholds 511, 513, and 515, the second programming pass 516 can be performed. After the second programming pass, the memory cell has eight Vt distributions 518, 520, 522, 524, 526, 528, 530, and 532 (also referred to as second-pass programming distributions) and seven read level thresholds 519, 521, 523, 525, 527, 529, and 531. The second programming pass 516 uses the data stored at the memory cell that was programmed during the first programming pass 504, as illustrated in FIG. 5. In another embodiment, another cRLC operation can be performed to calibrate one or more of the eight read level thresholds after the second programming pass 516, such as before a third programming pass. That is, the cRLC operation can be performed before each subsequent programming pass operation in a multi-pass programming sequence.

Figure 6:
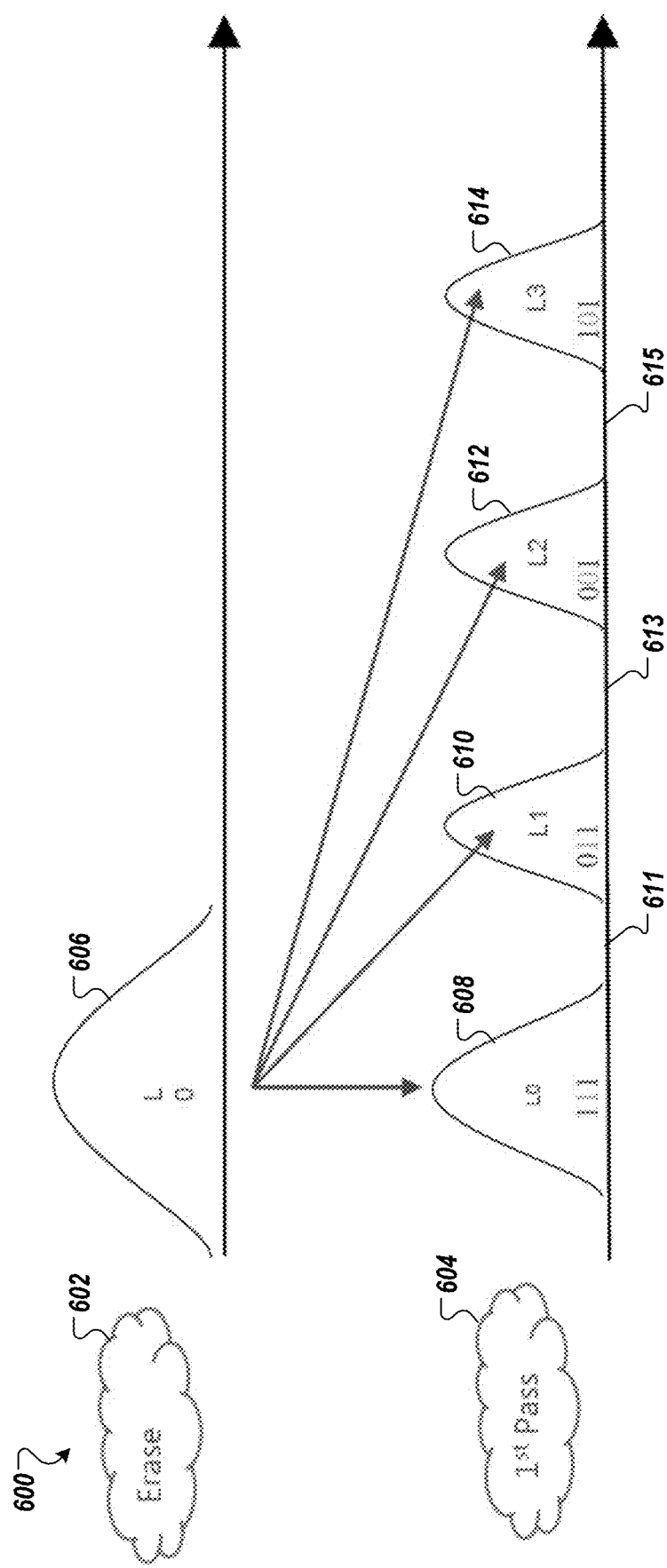
FIG. 6 illustrates a first-pass four-level programming operation with four Vt distributions in accordance with some embodiments of the present disclosure.

FIG. 6 illustrates a first-pass four-level programming operation 600 with four Vt distributions in accordance with some embodiments of the present disclosure. Before a first programming pass 604, a memory cell is in an erased state 602 and has a single Vt distribution 606. The first programming pass 604 programs four levels of the memory cell, including a lower page and an upper page of a page stack. That is, after the first programming pass 604, the memory cell has four Vt distributions 608, 610, 612, 614 and three read level thresholds 611, 613, and 615. Once the first programming pass 604 is performed, the cRLC operation can be performed to calibrate one or more of the read level thresholds 611, 613, and 615. In one embodiment, the read level threshold 611 can be calibrated to be centered between the Vt distribution 608 and the Vt distribution 610, the read level threshold 613 can be calibrated to be centered between the Vt distribution 610 and the Vt distribution 612, and the read level threshold 615 can be calibrated to be centered between the Vt distribution 612 and the Vt distribution 614. In another embodiment, any combination of the read level thresholds 611, 613, and 615 can be calibrated and the remaining one or more of the read level thresholds 611, 613, and 615 can be programmed in other subsequent programming operations to spread out the calibration of the read level thresholds over time. To calibrate the read level threshold 611, the cRLC operation can iteratively perform a read operation on the memory cell and iteratively measure a BER of the memory cell. The cRLC operation can adjust the read level threshold based on the BER that centers the read level threshold between the Vt distribution 608 and Vt distribution 610. In another embodiment, to calibrate the read level threshold 611, the cRLC operation calculates a CenterBEC and a DiffEC and uses these values to adjust the read level threshold 611. The read level thresholds 613 and 615 can be calibrated similarly in this same programming operation or in one or more subsequent operations as described herein. The read level thresholds 611, 613, and 615 can be adjusted to maintain minimum BER settings throughout the life of the memory cell and track variations in valley positions due to program/erase cycles, temperature, retention, or other factors. After the cRLC operation is performed to calibrate one or more of the read level thresholds 611, 613, and 615, a subsequent programming pass can be performed (not illustrated in FIG. 6). The read level thresholds 611, 613, and 615 can have corresponding trim values for the first programming pass 604 and these values can be adjusted to achieve a specified BER setting for the respective trim. These trim values can be separate values from those used for a subsequent programming pass.

In one embodiment, the cRLC algorithm described with respect to FIG. 6 can be used in a memory system with MLCs. Alternatively, the cRLC algorithm can be used in a memory system with other memory types where multi-pass programming operations are performed.

Figure 7:
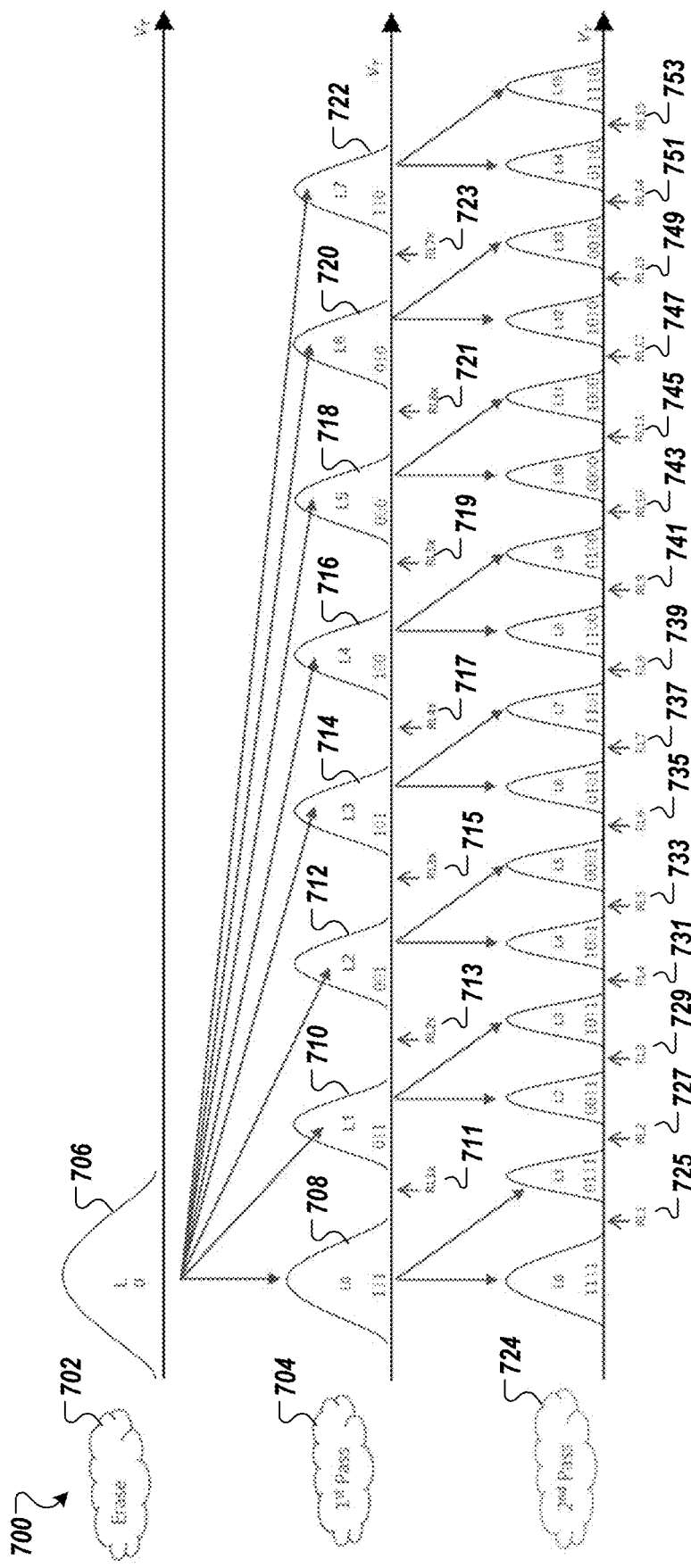
FIG. 7 illustrates a two-pass programming operation with eight-to-sixteen programming distributions and corresponding read level thresholds in accordance with some embodiments of the present disclosure

FIG. 7 illustrates a two-pass programming operation 700 with eight-to-sixteen programming distributions and corresponding read level thresholds in accordance with some embodiments of the present disclosure. Before a first programming pass 704, a memory cell is in an erased state 702 and has a single Vt distribution 706. After the first programming pass 704, the memory cell has eight Vt distributions 708, 710, 712, 714, 716, 718, 720, and 722 and seven read level thresholds 711, 713, 715, 717, 719, 721, and 723. Before a second programming pass 724, the cRLC operation can be performed to calibrate one or more of the read level thresholds 711, 713, 715, 717, 719, 721, and 723. The read level thresholds 711, 713, 715, 717, 719, 721, and 723 can be adjusted to maintain minimum BER settings throughout the life of the memory cell and track variations in valley positions due to program/erase cycles, temperature, retention, or other factors. The read level thresholds 711, 713, 715, 717, 719, 721, and 723 can have corresponding trim values for the first programming pass 704 and these values can be adjusted to achieve a specified BER setting for the respective trim. Separate trims can exist for the read level thresholds of the cell after the first programming pass 704 and for the read level thresholds of the cell after the second programming pass 724.

In one embodiment, the read level threshold 711 can be calibrated to be centered between the Vt distribution 708 and the Vt distribution 810. Similarly, the read level thresholds 713-723 can be centered between the respective pairs of Vt distributions. In another embodiment, any combination of the read level thresholds 711, 713, 715, 717, 719, 721, and 723 can be calibrated and the remaining one or more of the read level thresholds 711, 713, 715, 717, 719, 721, and 723 can be programmed in other subsequent programming operations to spread out the calibration of the read level thresholds over time. To calibrate the read level threshold 711, the cRLC operation can iteratively perform a read operation on the memory cell and iteratively measure a BER of the memory cell. The cRLC operation can adjust the read level threshold based on the BER that centers the read level threshold between the Vt distribution 708 and Vt distribution 710. In another embodiment, to calibrate the read level threshold 711, the cRLC operation calculates a CenterBEC and a DiffEC and uses these values to adjust the read level threshold 711. The read level thresholds 713-723 can be calibrated similarly in this same programming operation or in one or more subsequent operations as described herein. The read level thresholds 711, 713, 715, 717, 719, 721, and 723 can be adjusted to maintain minimum BER settings throughout the life of the memory cell and track variations in valley positions due to program/erase cycles, temperature, retention, or other factors.

After the cRLC operation is performed to calibrate one or more of the read level thresholds 711, 713, 715, 717, 719, 721, and 723, the second programming pass 724 can be performed. After the second programming pass, the memory cell has sixteen Vt distributions (not all individually labeled)

and fifteen read level thresholds 725, 727, 729, 731, 733, 735, 737, 739, 741, 743, 745, 747, 749, 751, and 753. The second programming pass 724 uses the data stored at the memory cell that was programmed during the first programming pass 704. In another embodiment, another cRLC operation can be performed to calibrate one or more of the eight read level thresholds after the second programming pass 724, such as before a third programming pass. That is, the cRLC operation can be performed before each subsequent programming pass operation in a multi-pass programming sequence.

Figure 8:
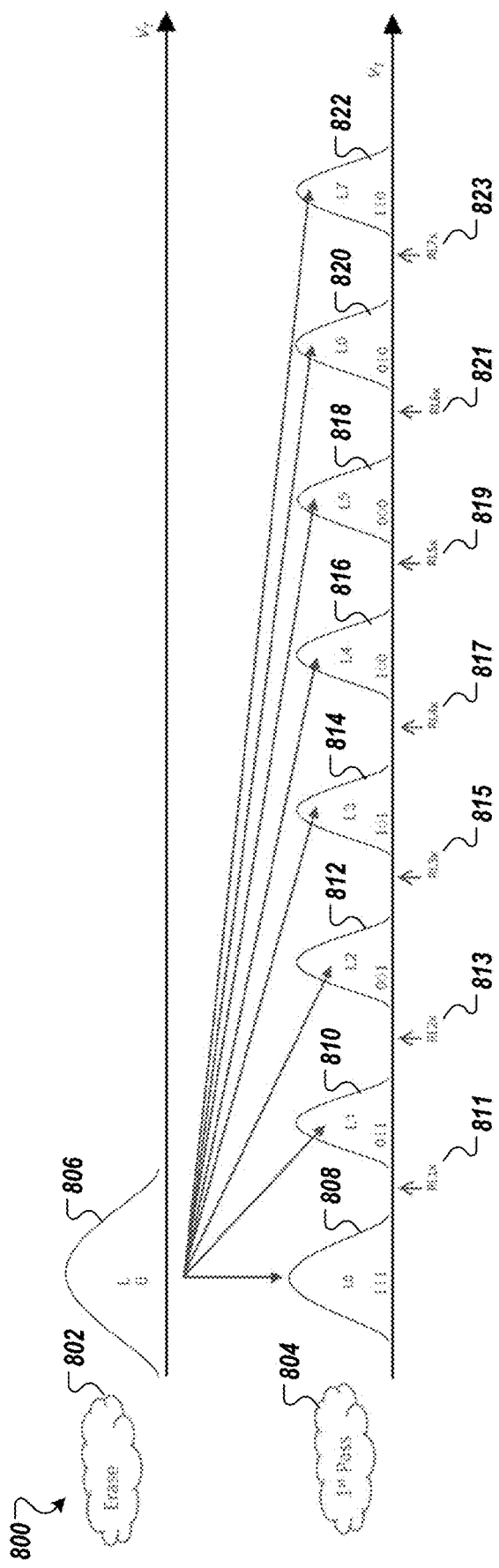
FIG. 8 illustrates a first-pass eight-level programming operation with eight Vt distributions in accordance with some embodiments of the present disclosure.

FIG. 8 illustrates a first-pass eight-level programming operation 800 with eight Vt distributions in accordance with some embodiments of the present disclosure. Before a first programming pass 804, a memory cell is in an erased state 802 and has a single Vt distribution 806. The first programming pass 804 programs eight levels of the memory cell, including a lower page, an upper page, and an extra page of a page stack. That is, after the first programming pass 804, the memory cell has eight Vt distributions 808, 810, 812, 814, 816, 818, 820, and 822 and seven read level thresholds 811, 813, 815, 817, 819, 821, and 823. Once the first programming pass 804 is performed, the cRLC operation can be performed to calibrate one or more of the read level thresholds 811, 813, 815, 817, 819, 821, and 823.

In one embodiment, the read level threshold 811 can be calibrated to be centered between the Vt distribution 808 and the Vt distribution 810. Similarly, the read level thresholds 813, 815, 817, 819, 821, and 823 can be centered between the respective pairs of Vt distributions 810-822. In another embodiment, any combination of the read level thresholds 811, 813, 815, 817, 819, 821, and 823 can be calibrated and the remaining one or more of the read level thresholds 811, 813, 815, 817, 819, 821, and 823, if any, can be programmed in other subsequent programming operations to spread out the calibration of the read level thresholds over time. To calibrate the read level threshold 811, the cRLC operation can iteratively perform a read operation on the memory cell and iteratively measure a BER of the memory cell. The cRLC operation can adjust the read level threshold based on the BER that centers the read level threshold between the Vt distribution 808 and Vt distribution 810. In another embodiment, to calibrate the read level threshold 811, the cRLC operation calculates a CenterBEC and a DiffEC and uses these values to adjust the read level threshold 811. The read level thresholds 813, 815, 817, 819, 821, and 823 can be calibrated similarly in this same programming operation or in one or more subsequent operations as described herein. The read level thresholds 811, 813, 815, 817, 819, 821, and 823 can be adjusted to maintain minimum BER settings throughout the life of the memory cell and track variations in valley positions due to program/erase cycles, temperature, retention, or other factors.

After the cRLC operation is performed to calibrate one or more of the read level thresholds 811, 813, 815, 817, 819, 821, and 823, a subsequent programming pass can be performed (not illustrated in FIG. 6). The read level thresholds 811, 813, 815, 817, 819, 821, and 823 can have corresponding trim values for the first programming pass 804 and these values can be adjusted to achieve a specified BER setting for the respective trim. These trim values can be separate values from those used for a subsequent programming pass.

In one embodiment, the cRLC algorithm described with respect to FIG. 8 can be used in a memory system with MLCs. Alternatively, the cRLC algorithm can be used in a memory system with other memory types where multi-pass programming operations are performed.

FIG. 9 is a page map 900 of a memory block for a full block program operation with multiple cRLC page stacks in accordance with some embodiments of the present disclosure. The page map 900 is a programming algorithm page map for a memory component having 38 wordlines (WL) per block and 9 wordline groups (WLGs) per block. The page map 900 may include sixteen sub-blocks in each block, where each sub-block of each WLG contains just one page type (e.g., LP, UP, XP, TP). The memory block may include SLC pages in the first and last WLGs, MLC pages in the second and second-to-last WLGs, and TLC pages in the intervening WLGs. Each read trim may be an N-bit offset register within the block. For example, an 8-bit offset register could be used where 7 bits are the magnitude and 1 bit is the sign convention. For each trim type, there can be a base trim value so that the offset trims for each page type are a +/− offset value relative to the base value. The offset value may correspond to the resolution of the trim.

During programming of the memory block selected for a first-pass cRLC operation, a block programming sequence is interrupted to perform cRLC. The programming interruption occurs at each page stack selected as one of the cRLC page stacks 902. The program interruption occurs just before a second programming pass when the first-pass programming distributions have fully aggressed floating gate coupling from their neighbors. During block programming, each of the cRLC page stacks 902 in each of the wordline groups is interrupted and a cRLC is performed until all valleys of the page stack are centered with minimum error rate. For example, during block programming the selected block, a first sample cRLC page stack 904 in a first wordline group 906 is interrupted and a cRLC operation is performed until all valleys (read level thresholds) of the first sample cRLC page stack 904 are centered with minimum error rate. Similarly, during block programming the selected block, a second cRLC page stack 908 in a second wordline group 910 is interrupted and a cRLC operation is performed until all valleys (read level thresholds) of the second sample cRLC page stack 908 are centered with minimum error rate. In one embodiment, the full cRLC algorithm is run until all trims within the first sample cRLC page stack 904 are confirmed to be at their minimum BER settings. Similarly, for the second sample cRLC page stack 910, the full cRLC algorithm is run until all trims are confirmed to be at their minimum BER settings. In another embodiment, the cRLC sampling and convergence to minimum BER settings is spread out over many programming operations. For example only one trim within the first sample cRLC page stack 904 gets one cRLC sample on a given block programming. The next block to be programmed would get the next cRLC sample for that trim and so on until enough blocks are programmed that all trims are converged to their minimum BER settings.

It should be noted that when used with 1st pass DPT, the cRLC information from each valley (read level threshold) is passed to the DPT algorithm for determining PV target modifications. The cRLC information may include CenterBEC, DiffEC, or the like.

FIG. 10 is a page map 1000 of a memory block for a partial block program operation in accordance with some embodiments of the present disclosure. During programming of the memory block selected for a first-pass cRLC operation, a block programming sequence of the block is programmed up to a specified page 1001, such as page 1339 as illustrated in FIG. 10. The block programming sequence is interrupted just before programming a next page 1003 of the corresponding page, such as the Top Page 1340 as illustrated in FIG. 10. At this point, and at each of the other cRLC page stacks 1004-1014, the cRLC algorithm is allowed to fully converge the read level thresholds to become "centered" before the programming sequence is resumed. As described herein, the cRLC information can be passed on to DPT to perform its rule based modification of the associated PV trims for the next programming operation.

Figure 11:
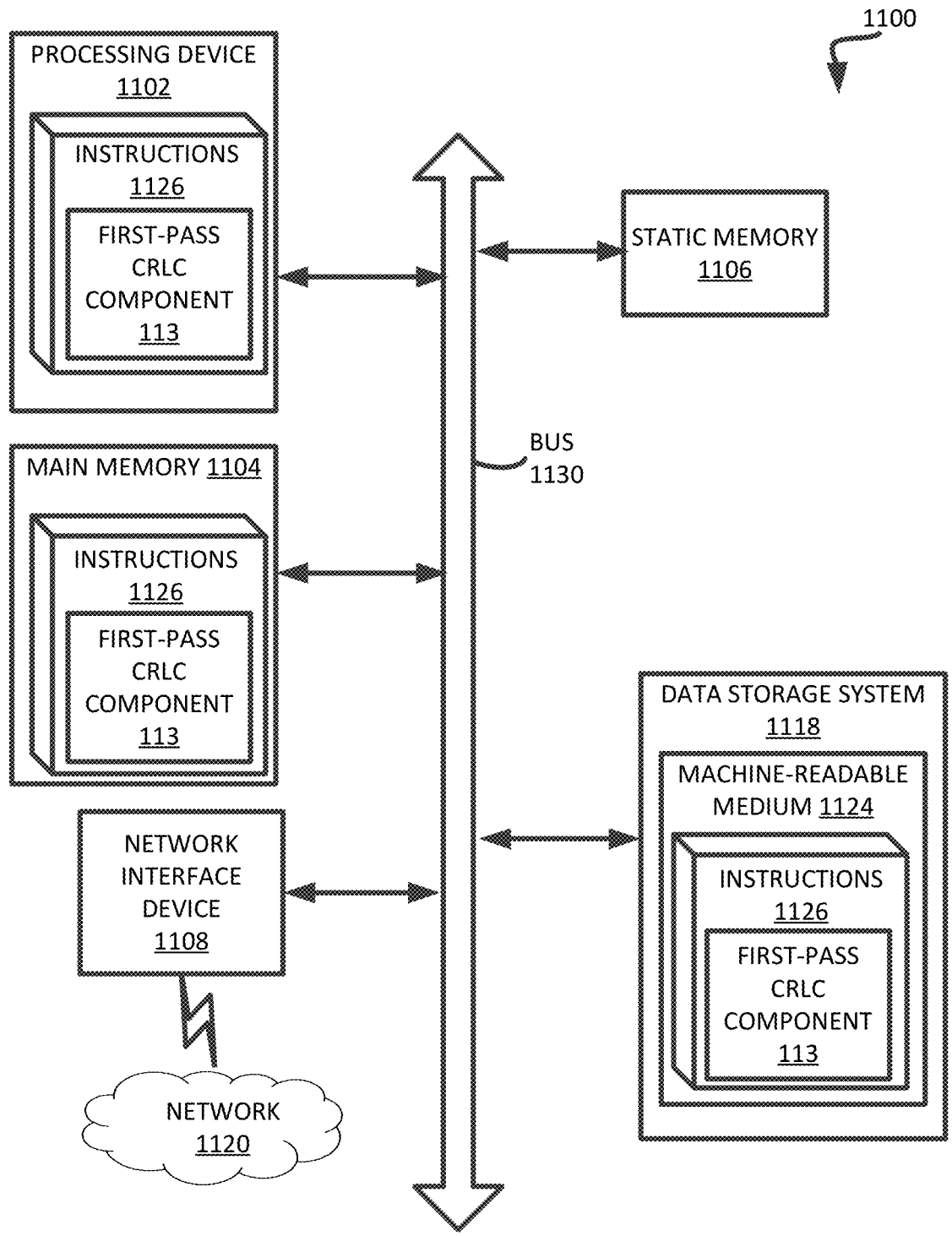
FIG. 11 is a block diagram of an example computer system in which embodiments of the present disclosure can operate.

FIG. 11 illustrates an example machine of a computer system 1100 within which a set of instructions, for causing the machine to perform any one or more of the methodologies discussed herein, can be executed. In some embodiments, the computer system 1100 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the first-pass cRLC component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM) or Rambus DRAM (RDRAM), etc.), a static memory 1106 (e.g., flash memory, static random access memory (SRAM), etc.), and a data storage system 1118, which communicate with each other via a bus 1130.

Processing device 1102 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 can also be one or more special-purpose processing devices such as an application specific integrated circuit (ASIC), a field programmable gate array (FPGA), a digital signal processor (DSP), network processor, or the like. The processing device 1102 is configured to execute instructions 1126 for performing the operations and steps discussed herein. The computer system 1100 can further include a network interface device 1108 to communicate over the network 1120.

The data storage system 1118 can include a machine-readable storage medium 1124 (also known as a non-transitory computer-readable storage medium) on which is stored one or more sets of instructions 1126 or software embodying any one or more of the methodologies or functions described herein. The instructions 1126 can also reside, completely or at least partially, within the main memory 1104 and/or within the processing device 1102 during execution thereof by the computer system 1100, the main memory 1104 and the processing device 1102 also constituting machine-readable storage media. The machine-readable storage medium 1124, data storage system 1118, and/or main memory 1104 can correspond to the memory sub-system 110 of FIG. 1.

In one embodiment, the instructions 1126 include instructions to implement functionality corresponding to a first-pass cRLC component (e.g., the first-pass cRLC component 113 of FIG. 1). While the machine-readable storage medium 1124 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a memory component; and
    a processing device, operatively coupled with the memory component, to:
        determine that a first programming pass of a programming operation has been performed on a memory cell of the memory component; and
        perform a continuous read level calibration (cRLC) operation on the memory cell to calibrate a read level threshold between a first first-pass programming distribution and a second first-pass programming distribution before a second programming pass of the programming operation is performed on the memory cell, wherein, to perform the cRLC operation, the processing device is further to:
            calculate a center bit error count;
            calculate a difference error count; and
            adjust the read level threshold of the memory cell based on the center bit error count and the difference error count.

2. The system of claim 1, wherein the processing device is further to:
    perform a second cRLC operation on the memory cell to calibrate a second read level threshold between the second first-pass programming distribution and a third first-pass programming distribution before the second programming pass of the programming operation is performed on the memory cell.

3. The system of claim 1, wherein the processing device is further to:
    perform one or more cRLC operations on the memory cell to calibrate a read level threshold between each pair of a plurality of first-pass programming distributions before the second programming pass of the programming operation is performed on the memory cell.

4. The system of claim 1, wherein the processing device is further to:
    perform a second cRLC operation on the memory cell to calibrate a second read level threshold between the second first-pass programming distribution and a third first-pass programming distribution after the second programming pass of the programming operation is performed on the memory cell.

5. The system of claim 1, wherein the processing device is further to:
    iteratively perform a read operation on the memory cell;
    iteratively measure a bit error rate (BER) of the memory cell; and
    adjust the read level threshold of the memory cell based on the BER of the memory cell to center the read level threshold between the first first-pass programming distribution and the second first-pass programming distribution.

6. The system of claim 1, wherein the processing device is further to:
    store the center bit error count and the difference error count for the read level threshold.

7. The system of claim 1, wherein the memory component comprises a block comprising a plurality of memory cells organized in a plurality of wordline groups, wherein the memory cell is a sample cell of a first wordline group of the plurality of wordline groups.

8. The system of claim 7, wherein the block further comprises a second sample memory cell of a second wordline group of the plurality of wordline groups, wherein the processing device is further to:
    determine that the first programming pass has been performed on the second sample memory cell; and
    perform a second cRLC operation on the second sample memory cell to calibrate a read level threshold between a third first-pass programming distribution and a fourth first-pass programming distribution before the second programming pass is performed on the second sample memory cell.

9. The system of claim 1, wherein the memory component comprises a first block comprising the memory cell and a second block comprising a second memory cell, and wherein the processing device is further to:
    determine that the first programming pass has been performed on the second memory cell; and
    perform a second cRLC operation on the second memory cell to calibrate a read level threshold between a third first-pass programming distribution and a fourth first-pass programming distribution before the second programming pass is performed on the second memory cell.

10. The system of claim 1, wherein the memory cell, after the second programming pass, comprises eight second-pass programming distributions and seven read level thresholds, each of the seven read level thresholds being set between two of the eight second-pass programming distributions.

11. The system of claim 1, wherein:
    the memory cell, after the first programming pass, comprises:
        eight first-pass programming distributions including the first first-pass programming distribution and the second first-pass programming distribution; and
        seven read level thresholds including the read level threshold, the memory cell, after the second programming pass, comprises:
sixteen second-pass programming distributions; and
fifteen read level thresholds, each of the fifteen read level thresholds being set between two of the sixteen second-pass programming distributions.

12. The system of claim 1, wherein the memory cell, after the first programming pass, comprises the first first-pass programming distribution, the second first-pass programming distribution, a third first-pass programming distribution, and a fourth first-pass programming distribution, wherein the read level threshold is between the first first-pass programming distribution and the second first-pass programming distribution, a second read level threshold is between the second first-pass programming distribution and the third first-pass programming distribution, and a third read level threshold is between the third first-pass programming distribution and the fourth first-pass programming distribution.

13. A system comprising:
a memory component; and
a processing device, operatively coupled with the memory component, to:
determine that a first programming pass of a programming operation has been performed on a memory cell of the memory component; and
perform a continuous read level calibration (cRLC) operation on the memory cell to calibrate a read level threshold between a first first-pass programming distribution and a second first-pass programming distribution before a second programming pass of the programming operation is performed on the memory cell, wherein the memory cell, after the first programming pass, comprises the first first-pass programming distribution, the second first-pass programming distribution, a third first-pass programming distribution, and a fourth first-pass programming distribution, wherein the read level threshold is between the first first-pass programming distribution and the second first-pass programming distribution, a second read level threshold is between the second first-pass programming distribution and the third first-pass programming distribution, and a third read level threshold is between the third first-pass programming distribution and the fourth first-pass programming distribution.

14. The system of claim 13, wherein the processing device is further to:
perform a second cRLC operation on the memory cell to calibrate the second read level threshold between the second first-pass programming distribution and the third first-pass programming distribution before the second programming pass of the programming operation is performed on the memory cell.

15. A method comprising:
initiating a block programming sequence on a block of a memory component, the block programming sequence comprising at least a first programming pass and a second programming pass;
during block programming of a first sample page stack in the block, interrupting the block programming sequence before the second programming pass is performed;
while the block programming sequence is interrupted, performing a continuous read level calibration (cRLC) operation on the first sample page stack until at least one read level threshold of a plurality of read level thresholds is centered between at least two programming distributions; and
resuming the block programming sequence, wherein the first sample page stack is in a first wordline group in the block, and wherein the method further comprises:
during block programming a second sample page stack in a second wordline group in the block, interrupting the block programming sequence before the second programming pass of the second sample page stack is performed;
while the block programming sequence of the second sample page stack is interrupted, performing a second cRLC operation on the second sample page stack until at least one read level threshold of a plurality of read level thresholds is centered between at least two programming distributions; and
resuming the block programming sequence.

16. The method of claim 15, wherein the performing the cRLC operation on the first sample page stack comprises performing the cRLC operation on the first sample page stack until the plurality of read level thresholds are each centered between a respective pair of programming distributions.

17. The method of claim 15, further comprising:
initiating a second block programming sequence on a second block of the memory component, the second block programming sequence comprising at least a first programming pass and a second programming pass;
during block programming of a third sample page stack in a wordline group in the second block, interrupting the second block programming sequence before the second programming pass of the second block programming sequence is performed;
while the second block programming sequence is interrupted, performing a third cRLC operation on the third sample page stack until at least one read level threshold of a plurality of read level thresholds is centered between at least two programming distributions; and
resuming the second block programming sequence.

18. A non-transitory computer-readable storage medium comprising instructions that, when executed by a processing device, cause the processing device to:
initiate a block programming sequence on a block of a memory component, the block programming sequence comprising at least a first programming pass and a second programming pass;
during block programming of a first sample page stack in the block, interrupt the block programming sequence before the second programming pass is performed;
while the block programming sequence is interrupted, perform a continuous read level calibration (cRLC) operation on the first sample page stack until at least one read level threshold of a plurality of read level thresholds is centered between at least two programming distributions; and
resume the block programming sequence, wherein the first sample page stack is in a first wordline group of the block;
initiate a second block programming sequence on a second block of the memory component, the second block programming sequence comprising at least a first programming pass and a second programming pass;
during block programming of a second sample page stack in a second wordline group in the second block, interrupt the second block programming sequence before the second programming pass of the second block programming sequence is performed;

while the second block programming sequence is interrupted, perform a second cRLC operation on the second sample page stack until at least one read level threshold of a plurality of read level thresholds is centered between at least two programming distributions; and resume the second block programming sequence.

19. The non-transitory computer-readable storage medium of claim 18, wherein the processing device is further to: perform the cRLC operation on the first sample page stack until the plurality of read level thresholds are each centered between a respective pair of programming distributions.

20. The non-transitory computer-readable storage medium of claim 18, wherein the processing device is further to:

during block programming of a third sample page stack in a second wordline group of the block, interrupt the block programming sequence before the second programming pass of the third sample page stack is performed;

while the block programming sequence of the third sample page stack is interrupted, perform a third cRLC operation on the third sample page stack until at least one read level threshold of a plurality of read level thresholds is centered between at least two programming distributions; and resume the block programming sequence.

* * * * *